(12) United States Patent
Lee et al.

(10) Patent No.: US 11,538,530 B2
(45) Date of Patent: Dec. 27, 2022

(54) SEMICONDUCTOR DEVICE

(71) Applicant: SK hynix Inc., Gyeonggi-do (KR)

(72) Inventors: Hee Youl Lee, Gyeonggi-do (KR); Je Bock Chung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 182 days.

(21) Appl. No.: 17/017,083

(22) Filed: Sep. 10, 2020

(65) Prior Publication Data

US 2021/0312991 A1 Oct. 7, 2021

(30) Foreign Application Priority Data

Apr. 6, 2020 (KR) .......................... 10-2020-0041734

(51) Int. Cl.
*G11C 16/16* (2006.01)
*H01L 27/11524* (2017.01)
*G11C 16/26* (2006.01)
*G11C 16/30* (2006.01)

(52) U.S. Cl.
CPC .............. *G11C 16/16* (2013.01); *G11C 16/26* (2013.01); *G11C 16/30* (2013.01); *H01L 27/11524* (2013.01)

(58) Field of Classification Search
None
See application file for complete search history.

(56) References Cited

U.S. PATENT DOCUMENTS 6,944,069 B2 * 9/2005 Kim .................... G11C 11/4096
365/194
9,424,931 B2 * 8/2016 Choi ...................... G11C 16/16

FOREIGN PATENT DOCUMENTS

KR 10-2014-0089792 7/2014
KR 10-2019-0007931 1/2019

* cited by examiner

*Primary Examiner* — Jason Lappas
(74) *Attorney, Agent, or Firm* — IP & T Group LLP

(57) ABSTRACT

A semiconductor device is provided which includes: a first group including a plurality of first memory blocks; a second group including a plurality of second memory blocks; a first common source line connected to the first group; a second common source line connected to the second group; a source line voltage supplying circuit supplying a source line voltage; a first switch controlling a connection between the first common source line and the source line voltage supplying circuit; and a second switch controlling a connection between the second common source line and the source line voltage supplying circuit. When one first memory block among the plurality of first memory blocks of the first group is selected, the first switch may be turned on, and the second switch may be turned off.

14 Claims, 10 Drawing Sheets

SEMICONDUCTOR DEVICE

CROSS-REFERENCE TO RELATED APPLICATION

The present application claims priority under 35 U.S.C. § 119(a) to Korean patent application number 10-2020-0041734, filed on Apr. 6, 2020, which is incorporated herein by reference in its entirety.

BACKGROUND

1. Field of Invention

The present disclosure generally relates to an electronic device and, more particularly, to a semiconductor device.

2. Description of Related Art

A semiconductor device may include a memory device configured to store data or output stored data. The memory device may be a volatile memory device in which stored data disappears when the supply of power is interrupted. Alternatively, the memory device may be a nonvolatile memory device in which stored data is retained even when the supply of power is interrupted. Examples of memory devices may include a Static RAM (SRAM), a Dynamic RAM (DRAM), a Synchronous DRAM (SDRAM), a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

The memory device may include a memory cell array configured to store data, a peripheral circuit configured to perform various operations such as a program operation, a read operation, and an erase operation, and a control logic configured to control the peripheral circuit. The memory device may be implemented in a structure in which memory cells are two-dimensionally arranged above a substrate or a structure in which memory cells are three-dimensionally stacked above a substrate.

SUMMARY

In accordance with an aspect of the present disclosure, there is provided a semiconductor device including: a first group including a plurality of first memory blocks; a second group including a plurality of second memory blocks; a first common source line connected to the first group; a second common source line connected to the second group; a source line voltage supplying circuit supplying a source line voltage; a first switch controlling a connection between the first common source line and the source line voltage supplying circuit; and a second switch controlling a connection between the second common source line and the source line voltage supplying circuit, wherein, when one first memory block among the plurality of first memory blocks of the first group is selected, the first switch is turned on, and the second switch is turned off.

In accordance with another aspect of the present disclosure, there is provided a semiconductor device including: first memory blocks; second memory blocks; a first common source line commonly connected to the first memory blocks; a second common source line commonly connected to the second memory blocks, the second common source line being electrically isolated from the first common source line; and a source line voltage supplying circuit supplying a source line voltage, wherein, when one first memory block among the first memory blocks is selected, the first common source line is electrically connected to the source line voltage supplying circuit.

These and other features and advantages of the present disclosure will become apparent to those with ordinary skill in the art to which the present invention belongs or pertains from the following figures and detailed description.

BRIEF DESCRIPTION OF THE DRAWINGS

Example embodiments will now be described more fully hereinafter with reference to the accompanying drawings; however, the present invention may be embodied in different other forms and should not be construed as limited to the embodiments set forth herein. Rather, these embodiments are provided so that this disclosure will be thorough and complete, and will fully convey the scope of the example embodiments to those skilled in the art.

Like reference numerals refer to like elements throughout.

DETAILED DESCRIPTION

Figure 1:
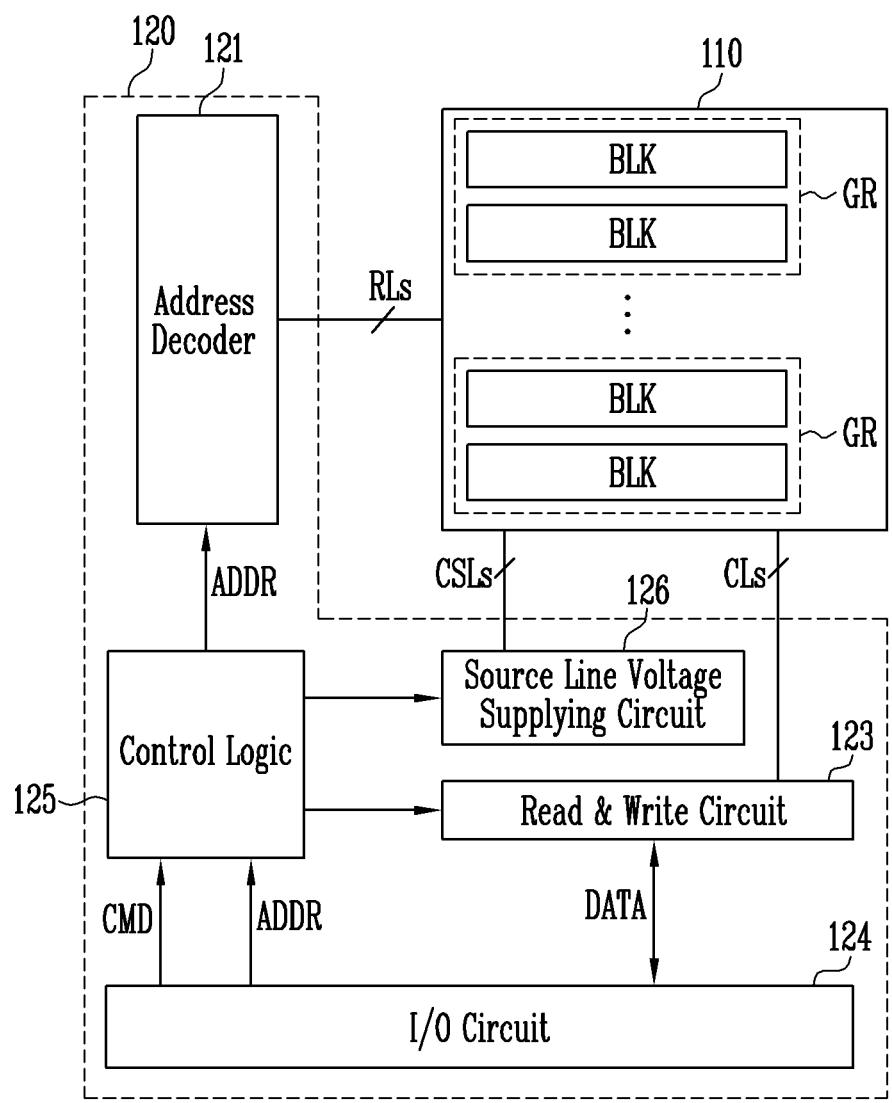
FIG. 1 is a block diagram illustrating a configuration of a semiconductor device in accordance with an embodiment of the present disclosure.

Various embodiments are directed to a semiconductor device with improved operational characteristics.

The specific structural or functional description disclosed herein is merely illustrative for the purpose of describing embodiments of the present disclosure. Embodiments may be implemented in various other forms, and should not be construed as limited to the embodiments set forth herein.

The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

In the drawing figures, dimensions may be exaggerated for clarity of illustration. It will be understood that when an element is referred to as being "between" two elements, it can be the only element between the two elements, or one or more intervening elements may also be present. It should be understood that the drawings are simplified schematic illustrations of the described devices and may not include well known details or components.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

It should also be noted that features present in one embodiment may be used with one or more features of another embodiment without departing from the scope of the invention.

FIG. 1 is a block diagram illustrating a configuration of a semiconductor device in accordance with an embodiment of the present disclosure.

Referring to FIG. 1, the semiconductor device 100 may include a cell array 110 and a peripheral circuit 120. The peripheral circuit 120 may include an address decoder 121, a read & write circuit 123, an input/output (I/O) circuit 124, a control logic 125, and a source line voltage supplying circuit 126. The semiconductor device 100 may be a memory device. In an embodiment, the semiconductor device 100 may be a volatile memory device. In another embodiment, the semiconductor device 100 may be a non-volatile memory device. For example, the semiconductor device 100 may be a flash memory device.

The cell array 110 may be connected to the address decoder 121 through row lines RLs, and be connected to the read & write circuit 123 through column lines CLs. The row lines RLs may be word lines, and the column lines CLs may be bit lines. However, the word lines and the bit lines are relative concepts. The row lines may be bit lines, and the column lines may be word lines.

The cell array 110 may be connected to the source line voltage supplying circuit 126 through common source lines CSLs. Switches may be connected between the common source lines CSLs and the source line voltage supplying circuit 126. Electrical connection between the common source lines CSLs and the source line voltage supplying circuit 126 may be controlled by the switches, and the switches may be controlled by the control logic 125.

The cell array 110 may include at least one plane. The plane may include a plurality of memory blocks BLK, and the memory blocks BLK may be grouped into groups GR. Each group GR may include a plurality of memory blocks BLK. The common source lines CSLs may be connected to the groups GR. The common source lines CSLs may be respectively connected to the groups GR in a one to one correspondence. Moreover, the common source lines CSLs which are connected to different groups GR may be individually driven. Each of the memory blocks BLK may include a plurality of memory strings. Also, each of the memory blocks BLK may include a plurality of pages.

The control logic 125 may be connected to the address decoder 121, the read & write circuit 123, the I/O circuit 124, and the source line voltage supplying circuit 126. The control logic 125 may receive a command CMD and an address ADDR from the I/O circuit 124. The control logic 125 may control the address decoder 121, the read & write circuit 123, and the source line voltage supplying circuit 126 to perform an internal operation according to the received command CMD.

The address decoder 121 may be connected to the cell array 110 through the row lines RLs. For example, the address decoder 121 may be connected to the cell array 110 through a word line, a dummy word line, a source select line, and a drain select line. Also, the address decoder 121 may control the row lines RLs under the control of the control logic 125. For example, the address decoder 121 may receive an address ADDR from the control logic 125, and select one group GR among the groups GR of the cell array 110. As another example, the address decoder 121 may select one block BLK among the memory blocks BLK of the cell array 110 according to the received address ADDR.

A program operation and a read operation of the semiconductor device 100 may be performed in a unit of a page. For example, in the program operation and the read operation, an address ADDR may include a block address and a row address. The address decoder 121 may decode a block address in the received address ADDR. The address decoder 121 may generate a block select signal according to the decoded block address, and select one memory block BLK according to the block select signal. Also, the address decoder 121 may generate a group select signal according to the decoded block address or the block select signal. The address decoder 121 may select one group GR according to the group select signal.

The address decoder 121 may decode a row address in the received address ADDR, and select any one page of the selected memory block BLK according to the decoded row address.

An erase operation of the semiconductor device 100 may be performed in a unit of a memory block. For example, in an erase operation, an address ADDR may include a block address. The address decoder 121 may decode a block address in the received address ADDR. The address decoder 121 may select one memory block BLK according to the decoded block address, and select a group GR to which the corresponding memory block belongs to.

The source line voltage supplying circuit 126 supplies a source line voltage to the common source lines CSLs. The source line voltage supplying circuit 126 may supply a source line voltage for a program, read, or erase operation in response to a command CMD. A group GR may be selected according to a group select signal, and a common source line of the selected group GR may be electrically connected to the source line voltage supplying circuit 126. An unselected group GR may be electrically disconnected from the source line voltage supplying circuit 126, and be floated. The source line voltage may be applied to only the common source line CSL of the selected group GR, and not to a common source line CSL of an unselected group GR. The source line voltage may include an erase voltage, a power voltage, a ground voltage, a precharge voltage, etc.

The read & write circuit 123 may be connected to the cell array 110 through the column lines CLs. The read & write circuit 123 may include a plurality of page buffers. The page buffers may access the cell array 110 through the column lines CLs.

In a program operation, the read & write circuit 123 may transfer data DATA received from the I/O circuit 124, and memory cells of a selected page may be programmed according to the transferred data DATA. The data DATA may be multi-bit data to be respectively programmed to the memory cells. In a read operation, the read & write circuit 123 may read data DATA from the memory cells of the selected page through the column lines CLs, and output the read data DATA to the I/O circuit 124. In an erase operation, the read & write circuit 123 may float the column lines CLs. A verify operation may be included in the program operation and the erase operation. The verify operation may be performed in a manner similar to that of the read operation.

Figure 2:
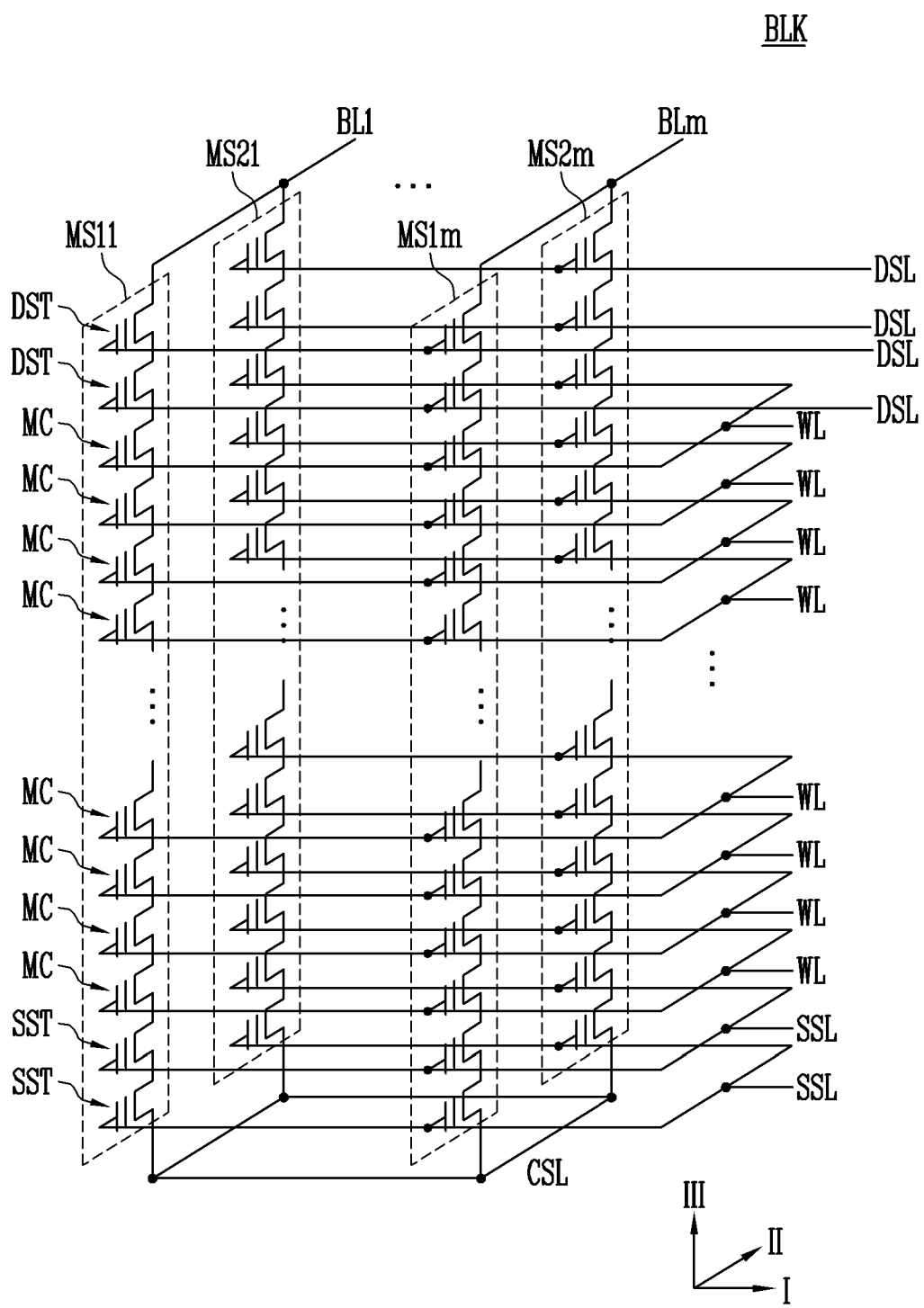
FIGS. 2 and 3 are circuit diagrams illustrating a cell array structure of the semiconductor device in accordance with an embodiment of the present disclosure.
Figure 3:
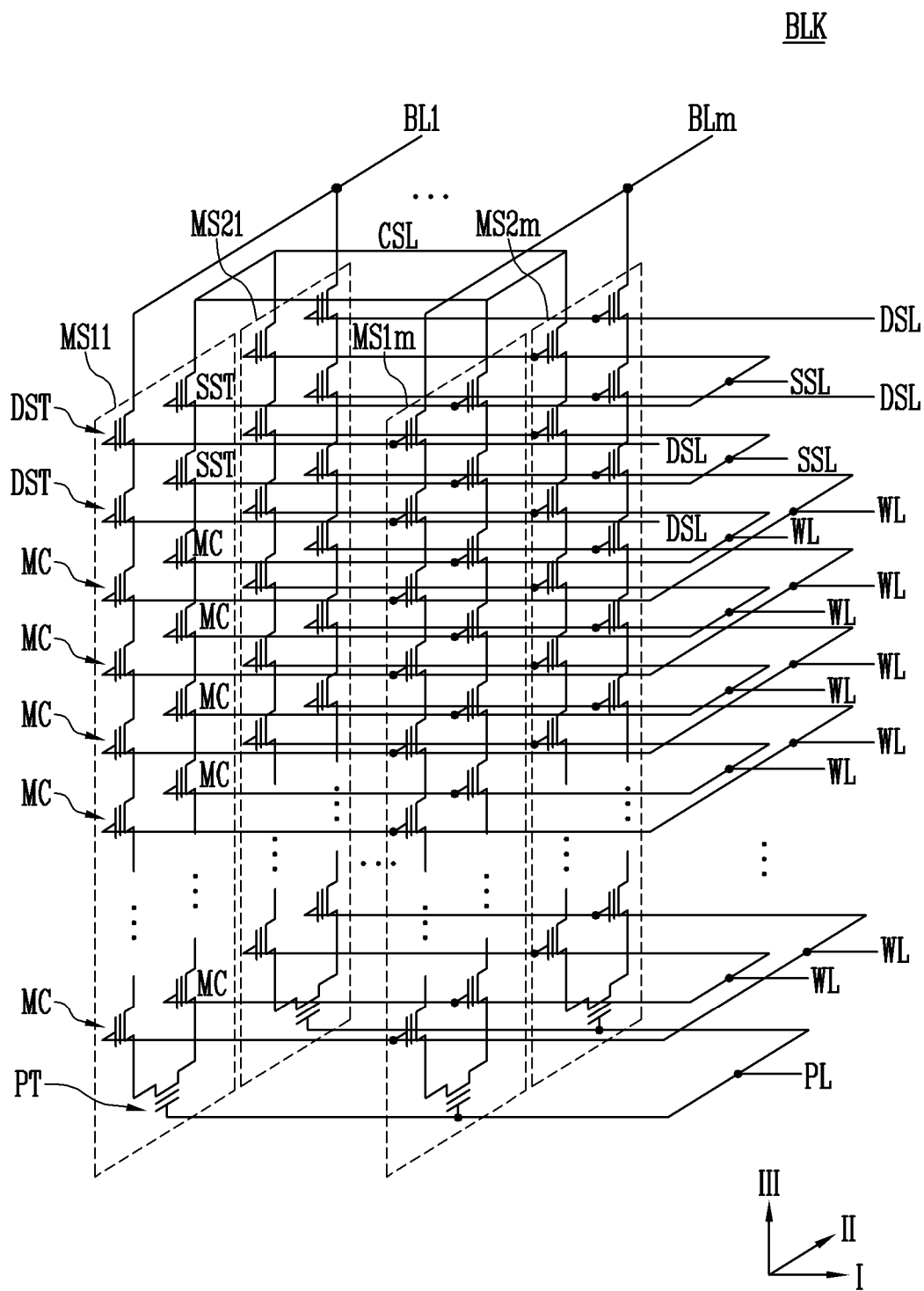

FIGS. 2 and 3 are circuit diagrams illustrating a cell array structure of the semiconductor device in accordance with an embodiment of the present disclosure.

Referring to FIG. 2, the cell array may include a plurality of memory blocks BLK. The memory blocks BLK may be arranged along a first direction I, be arranged along a second direction II intersecting the first direction I, or be arranged along the first direction I and the second direction II. Also, the memory blocks BLK may be stacked along a third direction III. The third direction III may be a direction protruding from a plane defined by the first direction I and the second direction II. The third direction III may be perpendicular to the plane.

Each of the memory blocks BLK may include a plurality of memory strings MS11 to MS1$m$ and MS21 to MS2$m$. Each of the memory strings MS11 to MS1$m$ and MS21 to MS2$m$ may extend along the third direction III. The third direction III may be a direction in which memory cells MC are stacked. In this embodiment, m may be an integer of 2 or more.

A first memory block BLK1 may include memory strings MS11 to MS1$m$ and MS21 to MS2$m$ connected between bit lines BL1 to BLm and a common source line CSL. Memory strings arranged in a same line in the second direction II among the memory strings MS11 to MS1$m$ and MS21 to MS2$m$ may share a corresponding one of the bit lines BL1 to BLm.

Each of the memory strings MS11 to MS1$m$ and MS21 to MS2$m$ may include at least one source select transistor SST, a plurality of memory cells MC, and at least one drain select transistor DST. Each of the memory strings MS11 to MS1$m$ and MS21 to MS2$m$ may further include at least one source-side dummy memory cell connected between the source select transistor SST and the memory cells MC. Each of the memory strings MS11 to MS1$m$ and MS21 to MS2$m$ may further include at least one drain-side dummy memory cell connected between the drain select transistor DST and the memory cells MC.

At least one source select transistor SST included in each one of the memory strings MS11 to MS1$m$ and MS21 to MS2$m$ may be connected in series between the memory cells MC and the common source line CSL. Gate electrodes of the source select transistors SST may be connected to at least one source select line SSL. In addition, source select transistors SST at the same level may be connected to the same source select line SSL.

Memory cells MC included in each one of the memory strings MS11 to MS1$m$ and MS21 to MS2$m$ may be connected in series between the source select transistor SST and the drain select transistor DST. Gate electrodes of the memory cells MC may be connected to word lines WL, and memory cells MC at the same level may be connected to the same word line WL. Word line voltages (a program bias, a pre-program bias, a read bias, and the like) necessary for driving the memory cells MC may be applied to each of the word lines WL.

At least one drain select transistor DST included in each one of the memory strings MS11 to MS1$m$ and MS21 to MS2$m$ may be connected in series between a corresponding bit line among the bit lines BL1 to BLm and the memory cells MC. Gate electrodes of the drain select transistors DST may be connected to at least one drain select line DSL. Drain select transistors DST at the same level among the drain select transistors DST of the memory strings (MS11 to MS1$m$ or MS21 to MS2$m$) arranged on the same row (in the first direction I) may be connected to the same drain select line DSL. In addition, drain select transistors SST arranged on different rows (in the first direction I) may be connected to different drain select lines DSL.

Memory strings MS11 to MS1$m$ and MS21 to MS2$m$ belonging to the same memory block BLK share a common source line CSL. In addition, the plurality of memory blocks BLK may share the common source line, and memory blocks sharing the common source line CSL may constitute one group. Common source lines CSL connected to different groups may be individually driven.

Referring to FIG. 3, the memory block BLK may include memory strings MS11 to MS1$m$ and MS21 to MS2$m$ connected between a common source line CSL and bit lines BL1 to BLm. Each of the memory strings MS11 to MS1$m$ and MS21 to MS2$m$ may include at least one source select transistor SST, a plurality of memory cells MC, at least one pipe transistor PT, a plurality of memory cells MC, and at least one drain select transistor DST, which are connected in series. Each of the memory strings MS11 to MS1$m$ and MS21 to MS2$m$ may be arranged in a 'U' shape.

The pipe transistor PT may connect drain-side memory cells MC and source-side memory cells MC. In addition, a gate of the pipe transistor PT of each of the memory strings MS11 to MS1$m$ and MS21 to MS2$m$ may be connected to a pipe line PL. The rest of the structure is similar to that described with reference to FIG. 2, and for example, overlapping descriptions will be omitted.

Figure 4:
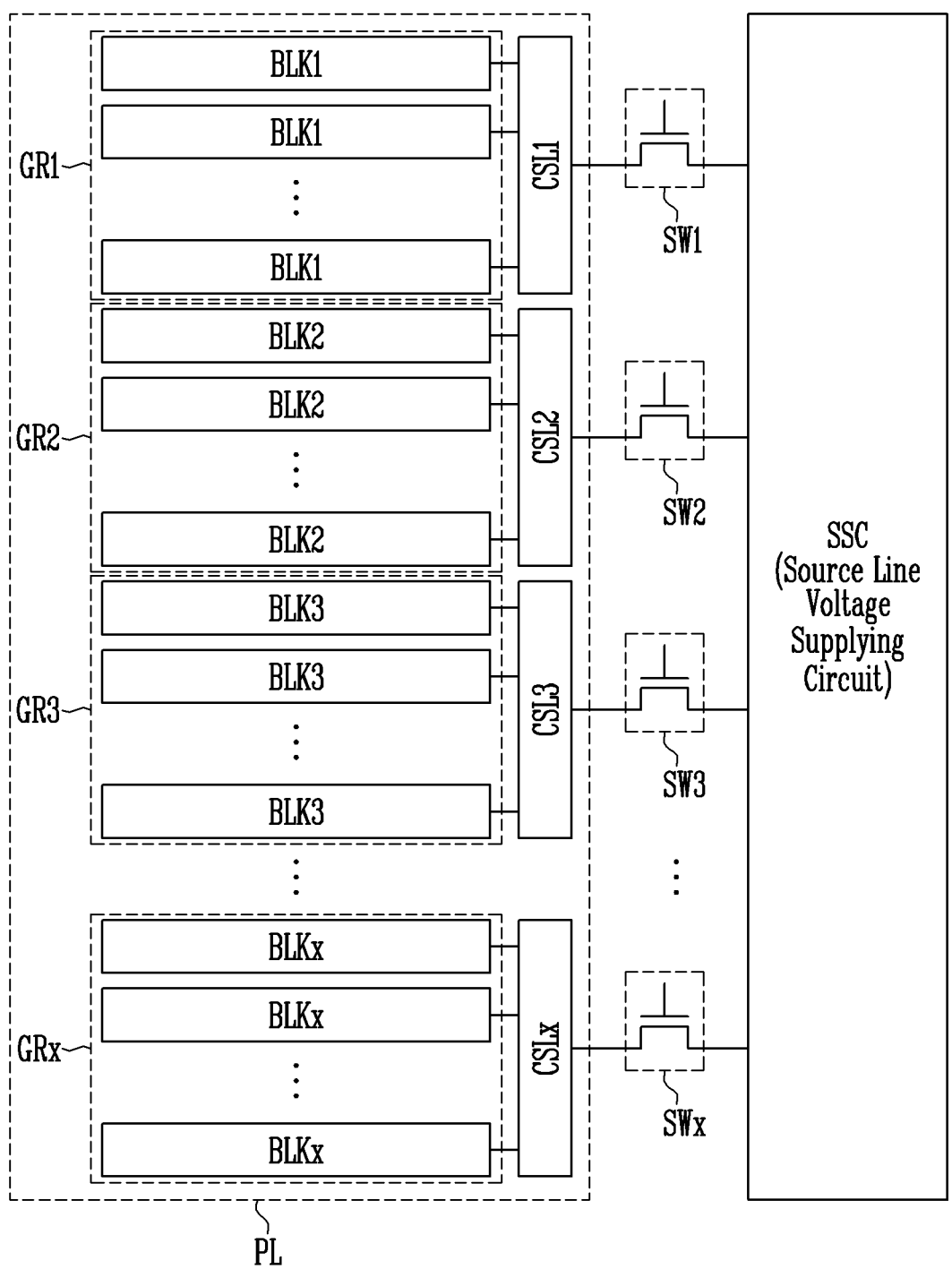
FIG. 4 is a diagram illustrating a configuration of a semiconductor device in accordance with an embodiment of the present disclosure.

FIG. 4 is a diagram illustrating a configuration of a semiconductor device in accordance with an embodiment of the present disclosure.

Referring to FIG. 4, the semiconductor device may include memory blocks BLK1 to BLKx, common source lines CSL1 to CSLx, and a source line voltage supplying circuit SSC. Also, the semiconductor device may further include switches SW1 to SWx. Here, x is an integer of 2 or more.

One plane PL may include a plurality of memory blocks BLK1 to BLKx. The memory blocks BLK1 to BLKx may be grouped into a plurality of groups GR1 to GRx. The number of memory blocks BLK1 to BLKx belonging to the groups GR1 to GRx may be equal to or different from each other. A first group GR1 may include first memory blocks BLK1. A second group GR2 may include second memory blocks BLK2. A third group GR3 may include third memory blocks BLK3. An xth group GRx may include xth memory blocks.

The one plane PL may include a plurality of common source lines CSL1 to CSLx. The common source lines CSL1 to CSLx may be electrically isolated from each other. The common source lines CSL1 to CSLx may be electrically connected to the source line voltage supplying circuit SSC respectively through the switches SW1 to SWx.

The common source lines CSL1 to CSLx may be respectively connected to the groups GR1 to GRx. A first common source line CSL1 may be connected to the first group GR1. The first common source line CSL1 may be commonly connected to the first memory blocks BLK1. A second common source line CSL2 may be connected to the second group GR2. The second common source line CSL2 may be commonly connected to the second memory blocks BLK2. A third common source line CSL3 may be connected to the third group GR3. The third common source line CSL3 may be commonly connected to the third memory blocks BLK3. An xth common source line CSLx may be connected to the xth group GRx. The xth common source line CSLx may be commonly connected to the xth memory blocks BLKx.

The source line voltage supplying circuit SSC supplies a source line voltage. The source line voltage supplying circuit SSC supplies the source line voltage according to a received command. The source line voltage may be an erase voltage, a power voltage, a ground voltage, a precharge voltage, and the like. In a program operation, the source line voltage supplying circuit SSC may supply a positive voltage. For example, the source line voltage supplying circuit SSC may supply a power voltage as the source line voltage. In a read operation, the source line voltage supplying circuit SSC may supply a ground voltage or supply a positive voltage. In an erase operation, the source line voltage supplying circuit SSC may supply an erase voltage.

Connection between the common source lines CSL1 to CSLx and the source line voltage supplying circuit SSC may be controlled by the switches SW1 to SWx. The switches SW1 to SWx may be turned on or turned off. The switches SW1 to SWx may be controlled by the control logic 125. A switch corresponding to a group to which a selected memory block belongs to may be turned on, and the other switches may be turned off. Accordingly, the source line voltage may be supplied to a common source line of a selected group, while common source lines of unselected groups may be floated. Meanwhile, in some cases, at least one of unselected switches may be turned on together with the selected switch. In these cases, the source line voltage may be supplied to at least one of unselected groups.

When one first memory block BLK1 among the first memory blocks BLK1 is selected, a first switch SW1 may be turned on by a group select signal, and the other switches SW2 to SWx may be turned off. The first common source line CSL1 may be electrically connected to the source line voltage supplying circuit SSC. In addition, the other common source lines CSL2 to CSLx may be electrically disconnected from the source line voltage supplying circuit SSC.

When one second memory block BLK2 among the second memory blocks BLK2 is selected, a second switch SW2 may be turned on by the group select signal, and the other switches SW1 and SW3 to SWx may be turned off. The second common source line CSL2 may be electrically connected to the source line voltage supplying circuit SSC. In addition, the other common source lines CSL1 and CSL3 to CSLx may be electrically disconnected from the source line voltage supplying circuit SSC, and be floated.

Similarly, when one third memory block BLK3 among the third memory blocks BLK3 is selected, a third switch SW3 may be turned on by the group select signal, and the other switches SW1, SW2, and SW4 to SWx may be turned off. The third common source line CSL3 may be electrically connected to the source line voltage supplying circuit SSC. In addition, the other common source lines CSL1, CSL2, and CSL4 to CSLx may be electrically disconnected from the source line voltage supplying circuit SSC, and be floated.

According to the configuration described above, operating characteristics of the semiconductor device can be improved. In a program operation, the loading capacitance of a common source line can be decreased, and the common source line can be rapidly charged. Further, the leakage current of the bit line can be reduced. In a read operation, the leakage current of the bit line can be reduced, and a read margin can be secured by reducing sensing current. In an erase operation, the stress of an unselected group can be reduced, and the read fail of a first page can be reduced.

Figure 5:
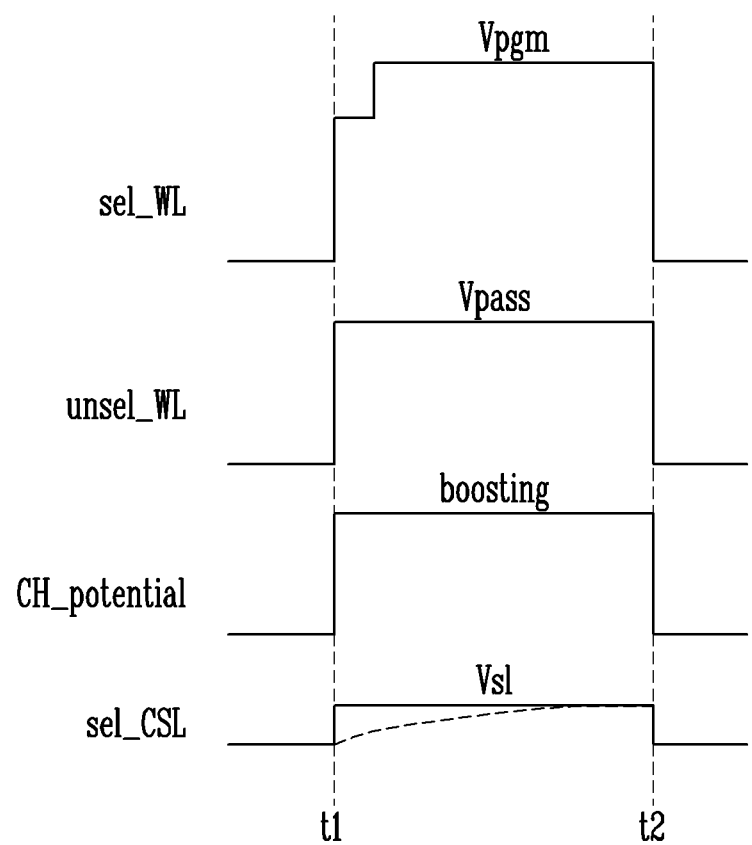
FIG. 5 is a diagram illustrating an operation of the semiconductor device in accordance with an embodiment of the present disclosure.

FIG. 5 is a diagram illustrating an operation of the semiconductor device in accordance with an embodiment of the present disclosure, which is illustrates a program operation condition of a program-inhibited memory string.

Referring to FIG. 5, at a first time t1, a program voltage Vpgm is applied to a selected word line sel_WL, and a pass voltage Vpass is applied to an unselected word line unsel_WL. A voltage of the selected word line sel_WL may reach the pass voltage Vpass and then increase to the program voltage Vpgm. A source select transistor and a drain select transistor are turned off, so that a channel of an unselected memory string can be boosted. Accordingly, a channel voltage CH_potential of the unselected memory string is increased, and the unselected memory string is program-inhibited.

A common source line sel_CSL corresponding to a selected group is electrically connected to the source line voltage supplying circuit, and a source line voltage Vsl is applied to the selected common source line sel_CSL. Unselected common source lines corresponding to an unselected group may be floated.

At a second time t2, the selected word line sel_WL, the unselected word line unsel_WL, and the selected common source line sel_CSL are discharged. The selected word line sel_WL may be discharged earlier than the unselected word line unsel_WL.

According to the operating method described above, common source lines included in one plane are individually controlled, so that program operation characteristics can be improved. When memory blocks included in the same plane share one common source line, the common source line may be slowly charged due to a capacitor between the common source line and a source select line of unselected memory blocks (see a dotted line). On the other hand, in accordance with the embodiment of the present disclosure, since the source line voltage Vsl is applied to only the selected common source line sel_CSL, the selected common source line sel_CSL can be rapidly charged.

Figure 6:
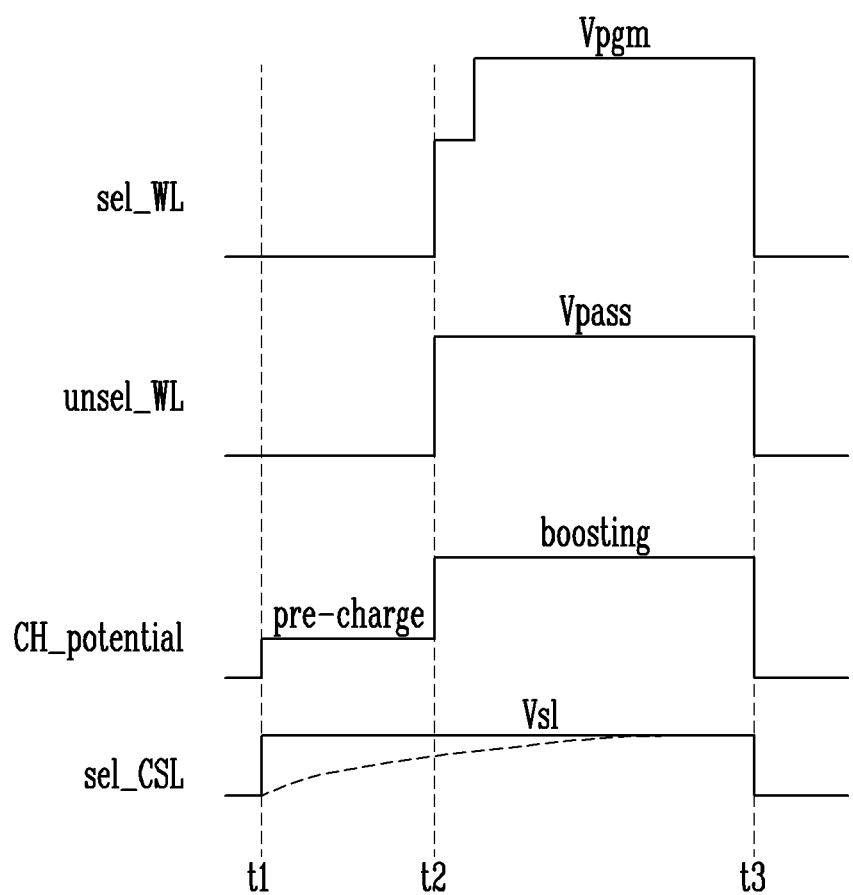
FIG. 6 is a diagram illustrating an operation of the semiconductor device in accordance with an embodiment of the present disclosure.

FIG. 6 is a diagram illustrating an operation of the semiconductor device in accordance with an embodiment of the present disclosure, which illustrates program operation conditions of a program-inhibited memory string.

Referring to FIG. 6, at a first time t1, a common source line sel_CSL corresponding to a selected group is electrically connected to the source line voltage supplying circuit, and a source line voltage Vsl is applied to the selected common source line sel_CSL. Unselected common source lines corresponding to an unselected group may be floated. A memory string is connected to the selected source line sel_CSL by turning on a source select transistor. Accordingly, a channel of the memory string is precharged.

At a second time t2, a program voltage Vpgm is applied to a selected word line sel_WL, and a pass voltage Vpass is applied to an unselected word line unsel_WL. A voltage of the selected word line sel_WL may reach the pass voltage Vpass and then increase to the program voltage Vpgm. The source select transistor and a drain select transistor are turned off, so that a channel of an unselected memory string can be boosted. Accordingly, a channel voltage CH_potential of the unselected memory string is increased.

At a third time t3, the selected word line sel_WL, the unselected word line unsel_WL, and the selected common source line sel_CSL are discharged. The selected word line sel_WL may be discharged earlier than the unselected word line unsel_WL.

According to the operating method described above, a channel region of the memory string is precharged by using the selected common source line sel_CSL. Thus, the channel region can be sufficiently boosted even when the pass voltage Vpass having a level lower than that of the pass voltage Vpass shown in FIG. 5 is used, and pass disturb can be minimized. Further, since the source line voltage Vsl is applied to only the selected common source line sel_CSL, the selected common source line sel_CSL can be rapidly charged.

Figure 7:
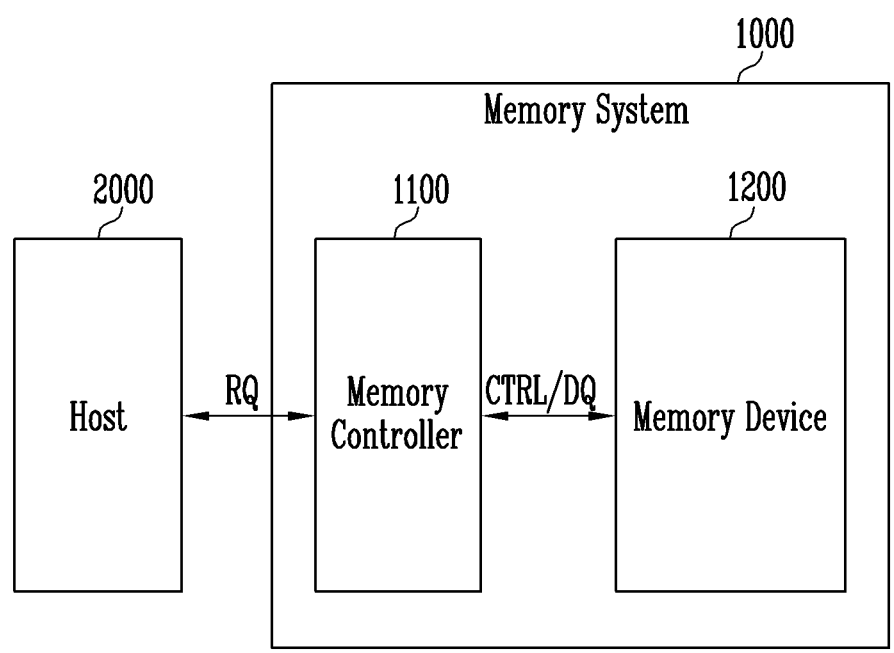
FIG. 7 is a diagram illustrating a memory system in accordance with an embodiment of the present disclosure.

FIG. 7 is a diagram illustrating a memory system in accordance with an embodiment of the present disclosure.

Referring to FIG. 7, the memory system 1000 may include a memory device 1200 configured to store data and a memory controller 1100 configured to communicate between the memory device 1200 and a host 2000.

The host 2000 may be a device or system which stores data in the memory system 1000 or retrieves data from the memory system 1000. The host 2000 may generate requests RQ for various operations, and output the generated requests RQ to the memory system 1000. The requests RQ may include a program request for a program operation, a read request for a read operation, an erase request for an erase operation, and the like. The host 2000 may communicate with the memory system 1000 through various interfaces such as Peripheral Component Interconnect-Express (PCI-E), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

The host 2000 may include at least one of a computer, a portable digital device, a tablet, a digital camera, a digital audio player, a television, a wireless communication device, and a cellular phone, but embodiments of the present disclosure are not limited thereto.

The memory controller 1100 may control the overall operations of the memory system 1000. The memory controller 1100 may control the memory device 1200 according to a request RQ of the host 2000. The memory controller 1100 may control the memory device 1200 to perform a program operation, a read operation, an erase operation, and the like according to a request of the host 2000. Alternatively, the memory controller 1100 may perform a background operation for improving the performance of the memory system 1000 without any request of the host 2000.

The memory controller 1100 may transmit a control signal CTRL and a data signal DQ to the memory device 1200 to control an operation of the memory device 1200. The control signal CTRL and the data signal DQ may be transmitted to the memory device 1200 through different input/output lines. The data signal DQ may include a command CMD, an address ADD or data DATA. The control signal CTRL may be used to distinguish a period in which the data signal DQ is input.

The memory device 1200 may perform a program operation, a read operation, an erase operation, and the like under the control of the memory controller 1100. In an embodiment, the memory device 1200 may be implemented with a volatile memory device in which stored data disappears when the supply of power is interrupted. In an embodiment, the memory device 1200 may be implemented with a nonvolatile memory device in which stored data is retained even when the supply of power is interrupted. In an embodiment, the memory device 1200 may be the semiconductor device 100 described above. The memory device 1200 may be a flash memory device.

When a program, read or erase operation is requested from the host 2000, the memory controller 1100 commands the memory device 1200 to perform the program, read or erase operation such that a memory block is selected by using the method described with reference to FIGS. 1 to 6.

Figure 8:
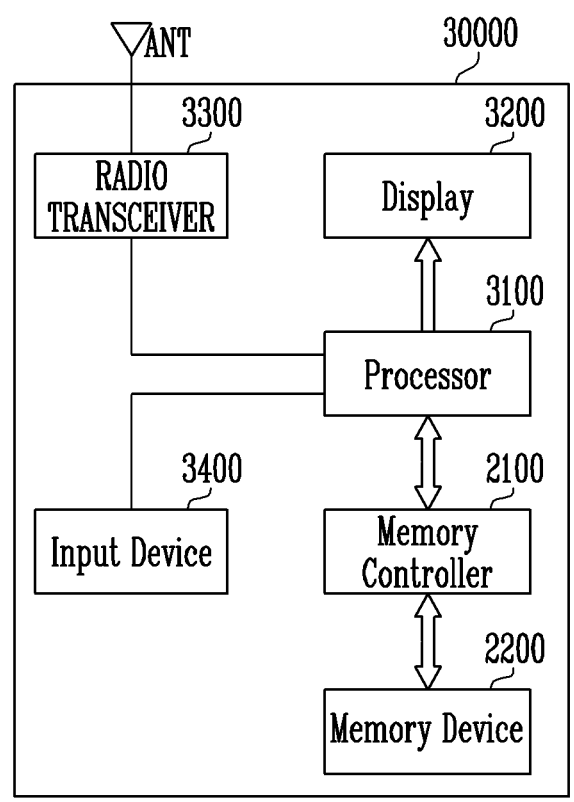
FIG. 8 is a diagram illustrating a memory system in accordance with an embodiment of the present disclosure.

FIG. 8 is a diagram illustrating a memory system in accordance with an embodiment of the present disclosure.

Referring to FIG. 8, the memory system 30000 may be implemented as a cellular phone, a smart phone, a tablet PC, a personal digital assistant (PDA), or a wireless communication device. The memory system 30000 may include a memory device 2200 and a memory controller 2100 capable of controlling an operation of the memory device 2200.

The memory controller 2100 may control a data access operation of the memory device 2200, e.g., a program operation, an erase operation, a read operation, or the like under the control of a processor 3100.

Data programmed in the memory device 2200 may be output through a display 3200 under the control of the memory controller 2100.

A radio transceiver 3300 may transmit/receive radio signals through an antenna ANT. For example, the radio transceiver 3300 may change a radio signal received through the antenna ANT into a signal that can be processed by the processor 3100. For example, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad, a computer mouse, a keypad, or a keyboard. The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

Figure 9:
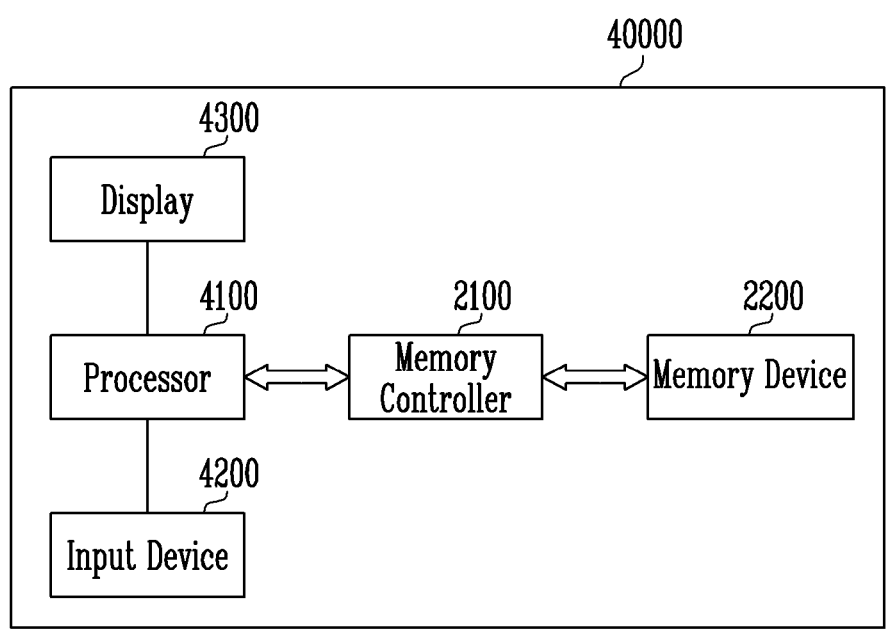
FIG. 9 is a diagram illustrating a memory system in accordance with an embodiment of the present disclosure.

FIG. 9 is a diagram illustrating a memory system in accordance with an embodiment of the present disclosure.

Referring to FIG. 9, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 2200 and a memory controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad, a computer mouse, a keypad, or a keyboard.

The processor 4100 may control the overall operations of the memory system 40000, and control an operation of the memory controller 2100. In some embodiments, the memory controller 2100 capable of controlling an operation of the memory device 2200 may be implemented as a part of the processor 4100, or be implemented as a chip separate from the processor 4100.

Figure 10:
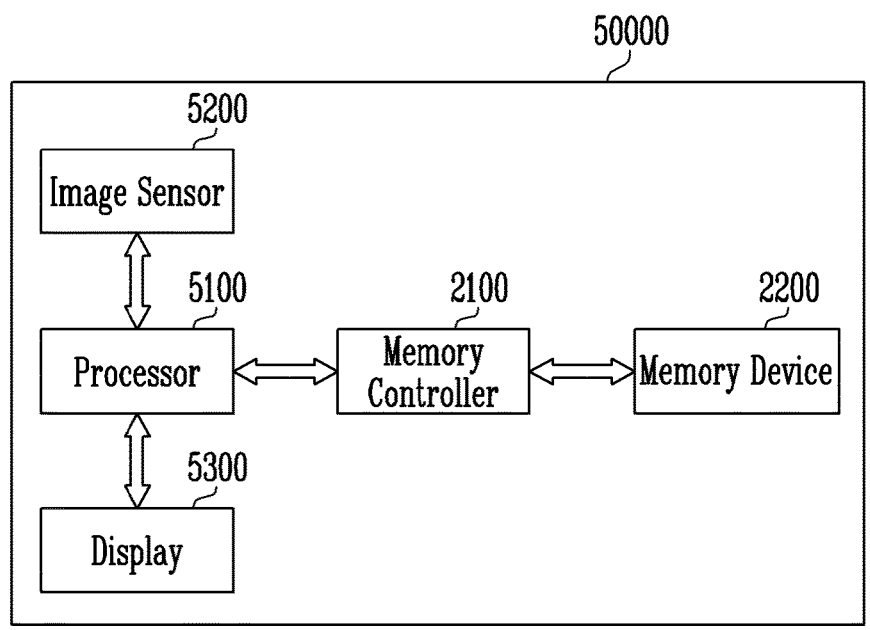
FIG. 10 is a diagram illustrating a memory system in accordance with an embodiment of the present disclosure.

FIG. 10 is a diagram illustrating a memory system in accordance with an embodiment of the present disclosure.

Referring to FIG. 10, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 2200 and a memory controller 2100 capable of controlling a data processing operation of the memory device 2200, e.g., a program operation, an erase operation, or a read operation.

An image sensor 5200 of the memory system 50000 may convert an optical image into digital signals, and the converted digital signals may be transmitted to a processor 5100 or the memory controller 2100. Under the control of the processor 5100, the converted digital signals may be output through a display 5300, or be stored in the memory device 2200 through the memory controller 2100. In addition, data stored in the memory device 2200 may be output through the display 5300 under the control of the processor 5100 or the memory controller 2100.

In some embodiments, the memory controller 2100 capable of controlling an operation of the memory device 2200 may be implemented as a part of the processor 5100, or be implemented as a chip separate from the processor 5100.

Figure 11:
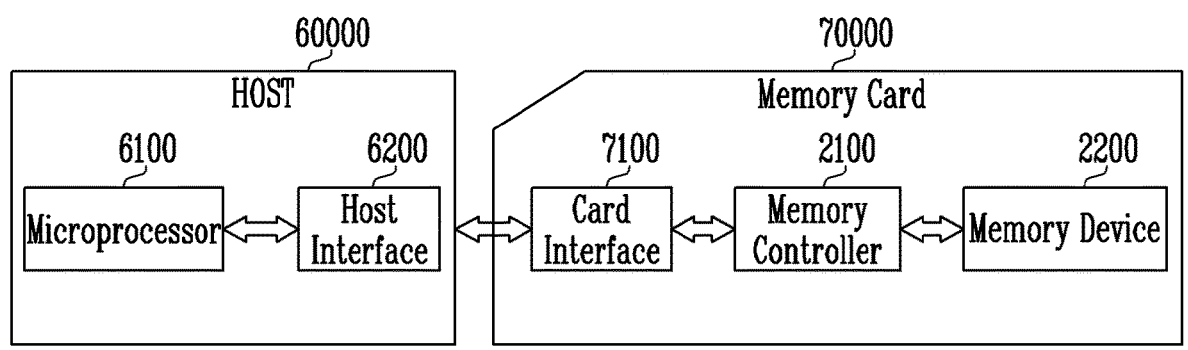
FIG. 11 is a diagram illustrating a memory system in accordance with an embodiment of the present disclosure.

FIG. 11 is a diagram illustrating a memory system in accordance with an embodiment of the present disclosure.

Referring to FIG. 11, the memory system 70000 may be implemented as a memory card or a smart card. The memory system 70000 may include a memory device 2200, a memory controller 2100, and a card interface 7100.

The memory controller 2100 may control data exchange between the memory device 2200 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 2100 according to a protocol of the host 60000. In some embodiments, the card interface 7100 may support a universal serial bus (USB) protocol and an inter-chip (IC)-USB protocol. The card interface 7100 may include hardware suitable for supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor 6100.

In accordance with the present disclosure, a semiconductor device is provided having improved operating characteristics and enhanced reliability.

While the present disclosure has been shown and described with reference to certain embodiments thereof, it will be understood by those skilled in the art that various changes in form and details may be made without departing from the spirit and scope of the present disclosure as defined by the appended claims and their equivalents. For example, the scope of the present disclosure should not be limited to the above-described embodiments but should be determined by not only the appended claims but also the equivalents thereof.

In the above-described embodiments, all operations may be selectively performed. In each embodiment, the operations are not necessarily performed in accordance with the described order and may be rearranged. The embodiments disclosed in this specification and drawings are examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used herein, those are only to describe the embodiments of the present disclosure. For example, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor device comprising:
a first group including a plurality of first memory blocks;
a second group including a plurality of second memory blocks;
a first common source line connected to the first group;
a second common source line connected to the second group;
a plurality of column lines connected to the first group and the second group;
a read and write circuit connected to the first group and the second group through the plurality of column lines;
a source line voltage supplying circuit supplying a source line voltage;
a first switch controlling a connection between the first common source line and the source line voltage supplying circuit; and
a second switch controlling a connection between the second common source line and the source line voltage supplying circuit,
wherein, when one first memory block among the plurality of first memory blocks of the first group is selected, the first switch is turned on, and the second switch is turned off.

2. The semiconductor device of claim 1, wherein, when one second memory block among the plurality of second memory blocks of the second group is selected, the second switch is turned on, and the first switch is turned off.

3. The semiconductor device of claim 1, wherein the first common source line and the second common source line are electrically isolated from each other.

4. The semiconductor device of claim 1, wherein, in a program operation, the source line voltage supplying circuit supplies a positive voltage.

5. The semiconductor device of claim 1, wherein, in a read operation, the source line voltage supplying circuit supplies a ground voltage or a positive voltage.

6. The semiconductor device of claim 1, wherein, in an erase operation, the source line voltage supplying circuit supplies an erase voltage.

7. The semiconductor device of claim 1, wherein the second common source line is floated when the second switch is turned off.

8. The semiconductor device of claim 1, further comprising:
- a third group including a plurality of third memory blocks;
- a third common source line connected to the third group; and
- a third switch controlling connection between the third common source line and the source line voltage supplying circuit.

9. The semiconductor device of claim 8, wherein, when one first memory block among the plurality of first memory blocks of the first group is selected, the first switch is turned on, and the second switch and the third switch are turned off.

10. The semiconductor device of claim 8, wherein, when one second memory block among the plurality of second memory blocks of the second group is selected, the second switch is turned on, and the first switch and the third switch are turned off.

11. The semiconductor device of claim 1, wherein the first group and the second group belong to a same plane.

12. A semiconductor device comprising:
- first memory blocks including a plurality of first memory strings, wherein each of the first memory strings includes a first source select transistor, a first drain select transistor, and a plurality of first memory cells;
- second memory blocks including a plurality of second memory strings, wherein each of the second memory strings includes a second source select transistor, a second drain select transistor, and a plurality of second memory cells;
- a first common source line commonly connected to the first memory blocks, wherein the first common source line is connected to the plurality of first memory cells via the first source select transistor;
- a second common source line commonly connected to the second memory blocks, the second common source line being electrically isolated from the first common source line, wherein the second common source line is connected to the plurality of second memory cells via the second source select transistor; and
- a source line voltage supplying circuit supplying a source line voltage,
- wherein, when one first memory block among the first memory blocks is selected, the first common source line is electrically connected to the source line voltage supplying circuit.

13. The semiconductor device of claim 12, wherein, when the one first memory block is selected, the second common source line is electrically disconnected from the source line voltage supplying circuit.

14. The semiconductor device of claim 12, wherein, when one second memory block among the second memory blocks is selected, the second common source line is electrically connected to the source line voltage supplying circuit, and the first common source line is electrically disconnected from the source line voltage supplying circuit.

* * * * *